(12) United States Patent
Ham et al.

(10) Patent No.: US 7,253,653 B2
(45) Date of Patent: Aug. 7, 2007

(54) TEST TRAY FOR HANDLER FOR TESTING SEMICONDUCTOR DEVICES

(75) Inventors: Chul Ho Ham, Gyeonggi-do (KR); Ho Keun Song, Seongnam-si (KR); Young Geun Park, Yongin-si (KR); Jae Bong Seo, Seongnam-si (KR)

(73) Assignee: Mirae Corporation, Chungchongnam-Do (KR)

( * ) Notice: Subject to any disclaimer, the term of this patent is extended or adjusted under 35 U.S.C. 154(b) by 0 days.

(21) Appl. No.: 11/235,248

(22) Filed: Sep. 27, 2005

(65) Prior Publication Data

US 2006/0192583 A1 Aug. 31, 2006

(30) Foreign Application Priority Data

Feb. 25, 2005 (KR) ............... 10-2005-0015870
Jun. 2, 2005 (KR) ............... 10-2005-0046988

(51) Int. Cl.
*G01R 31/26* (2006.01)
(52) U.S. Cl. ................................... 324/765
(58) Field of Classification Search ........ None
See application file for complete search history.

(56) References Cited

U.S. PATENT DOCUMENTS 6,876,215 B1 * 4/2005 Hannan et al. ............. 324/758
6,927,596 B2 * 8/2005 Bjork ...................... 324/765

* cited by examiner

Primary Examiner—Ha Tran Nguyen
Assistant Examiner—Trung Q. Nguyen
(74) Attorney, Agent, or Firm—Ked & Associates, LLP

(57) ABSTRACT

A test tray for a handler for testing semiconductor devices is disclosed which is capable of reducing the costs and time taken for replacement of carrier modules, and achieving an enhancement in workability. The test tray includes a frame, pockets mounted to the frame while being uniformly spaced apart from one another, each of the pockets including a seat on which a semiconductor device is to be seated, latches mounted to the frame to be arranged in pairs for respective pockets such that the latches of each latch pair face each other at opposite sides of an associated one of the pockets, respectively, each of the latches being movable between a first position where the latch holds a semiconductor device seated in the seat of the associated pocket and a second position where the latch releases the held state of the semiconductor device, and latch operating members each mounted to the frame, and adapted to move an associated one of the latches between the first position and the second position, each of the latch operating members being separate from the associated latch.

26 Claims, 16 Drawing Sheets

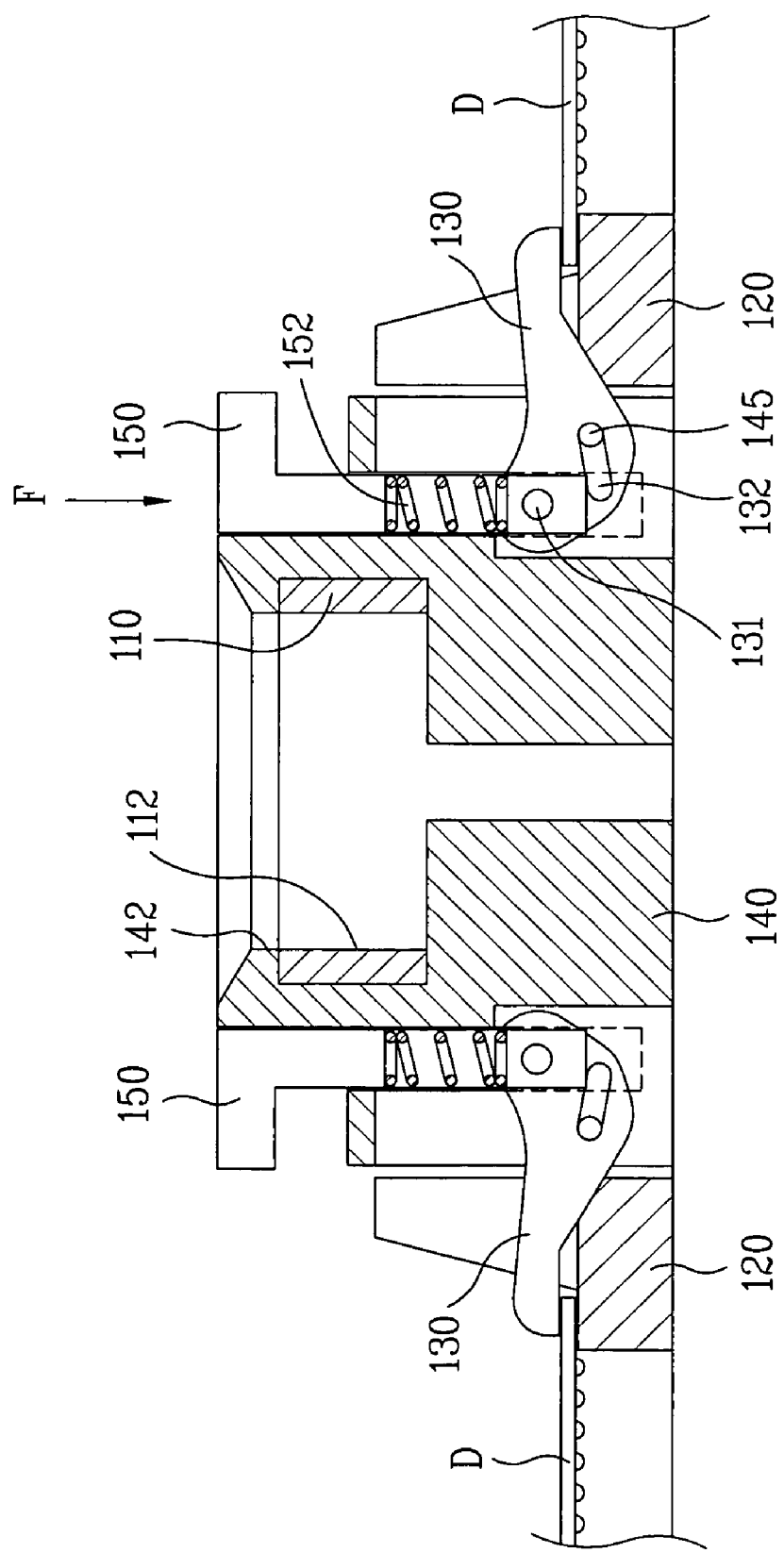

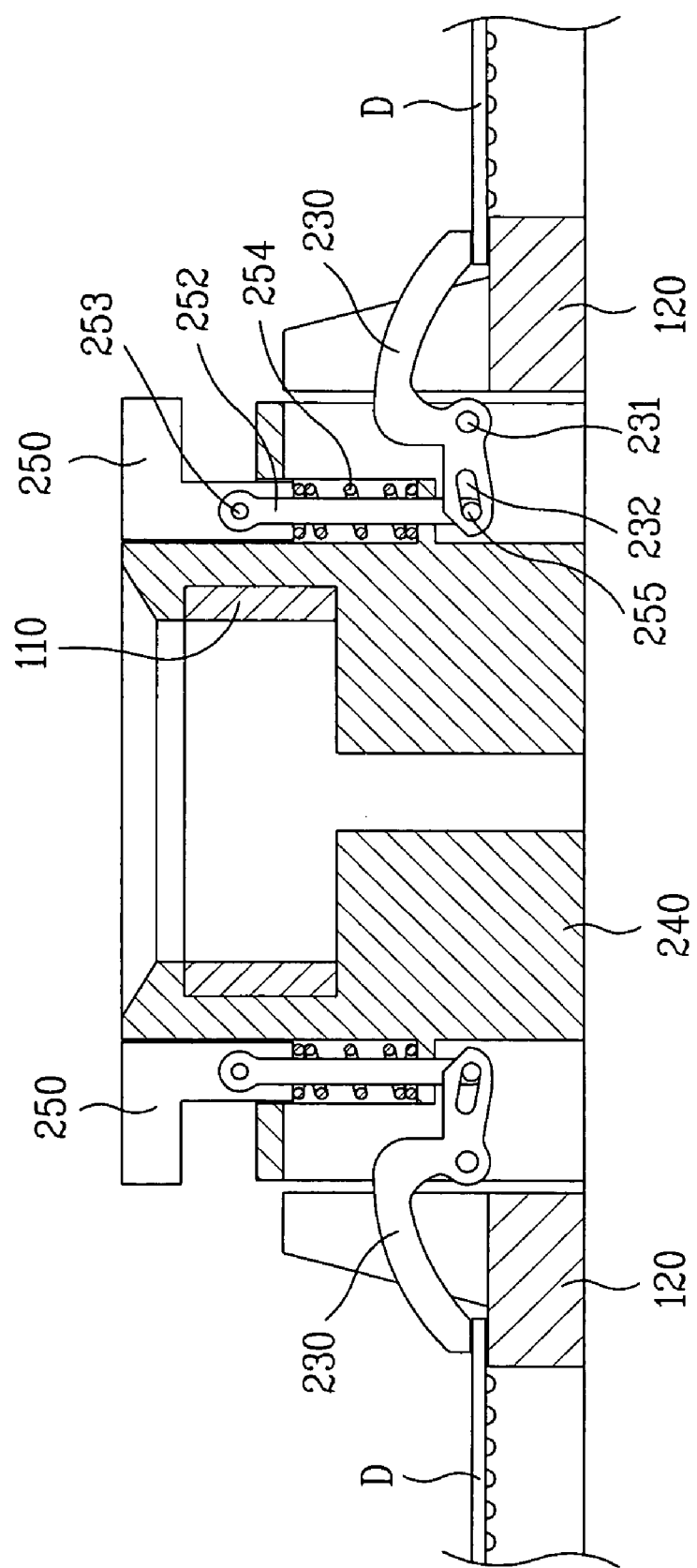

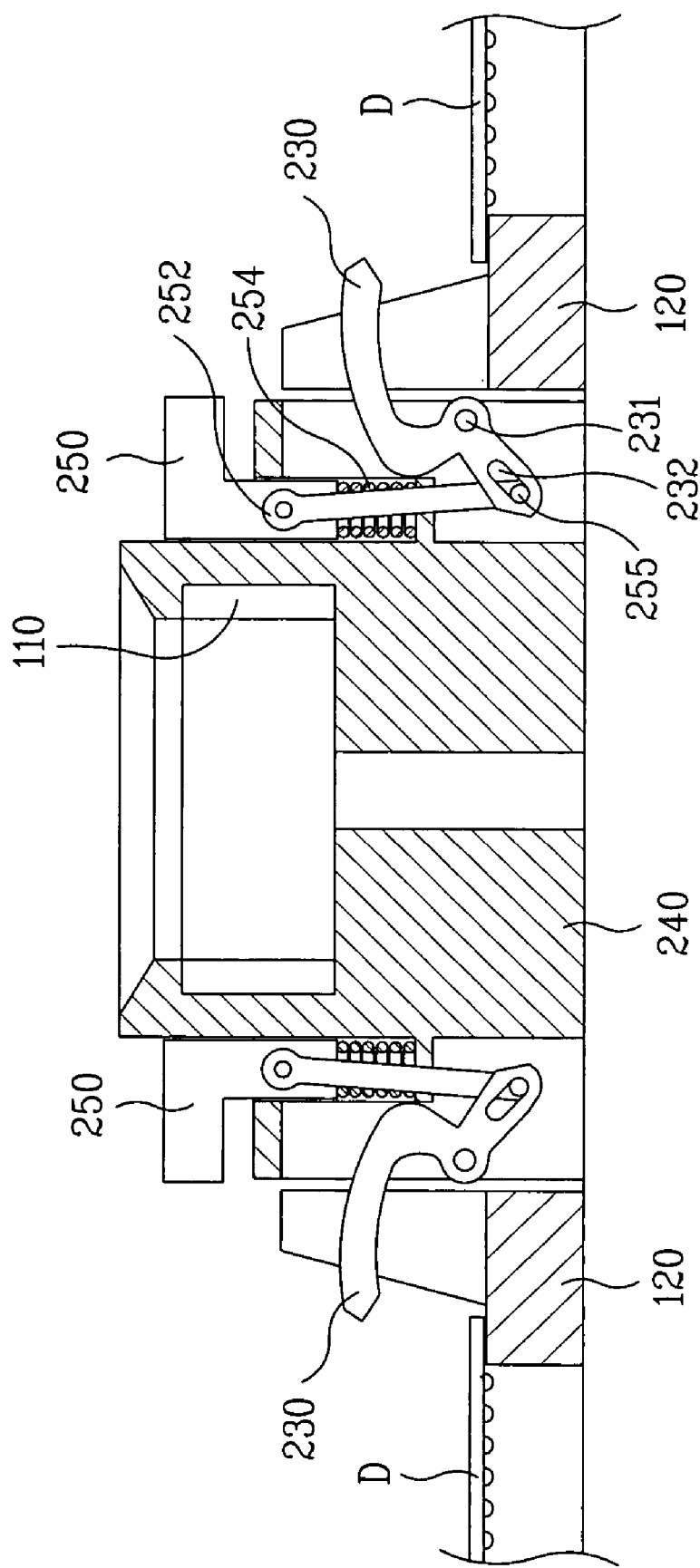

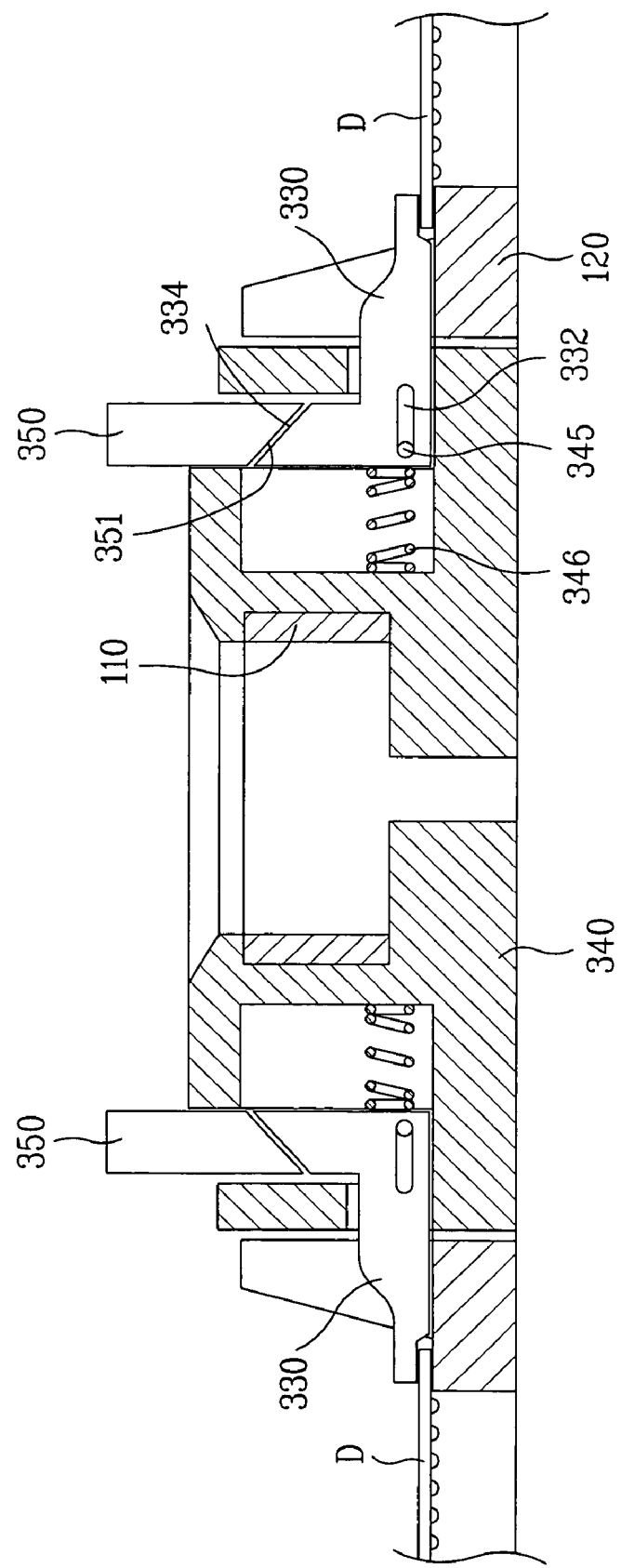

TEST TRAY FOR HANDLER FOR TESTING SEMICONDUCTOR DEVICES

This application claims the benefit of Korean Patent Application Nos. 2005-15870 filed on Feb. 25, 2005 and 2005-46988 filed on Jun. 2, 2005 which is hereby incorporated by reference as if fully set forth herein.

BACKGROUND OF THE INVENTION

1. Field of the Invention

The present invention relates to a handler for testing semiconductor devices, and more particularly, to a test tray for a handler for testing semiconductor devices which is adapted to feed the semiconductor devices, and includes carrier modules for holding the semiconductor devices.

2. Discussion of the Related Art

Generally, memory or non-memory semiconductor devices or modular ICs, each of which includes memory or non-memory semiconductor devices appropriately arranged on a substrate to form a circuit, are subjected to various tests after production thereof, but prior to shipment thereof.

In order to automatically achieve such a test for semiconductor devices or modular ICs, a handler is used. In such a handler, trays, in which semiconductor devices to be tested are received, are manually stacked in a loading stacker. The semiconductor devices are then loaded in a separate heat-resistant test tray which is, in turn, sent to a test station or site in order to test the semiconductor devices. In the test site, respective leads or balls of the semiconductor devices in the test tray are electrically connected to connectors of test sockets arranged in the test site, and are subjected to a desired electrical test. The semiconductor devices in the test-completed test tray are unloaded from the test tray, and are then sorted in accordance with the results of the test. The sorted semiconductor devices are then loaded in associated consumer trays, respectively. Thus, the test of the semiconductor devices is completed.

The test tray of the above-mentioned handler includes a plurality of carrier modules for aligning semiconductor devices to be tested at a pitch identical to the pitch of the test sockets, and holding the aligned semiconductor devices.

FIGS. 1 and 2 are views illustrating one test tray which is used in a conventional handler and is provided with carrier modules.

As shown in FIG. 1, carrier modules 20, to which semiconductor devices will be mounted, are arranged in a test tray 10 while being uniformly spaced apart from one another. Typically, 64 (16×4) carrier modules 20 are arranged in one test tray 10. However, various numbers of carrier modules, for example, 32 or 128 carrier modules, may be arranged in one test tray.

Each carrier module 20 is elastically held in the test tray 10 by a spring (not shown) mounted to a frame 11 of the test tray 10 such that the carrier module 20 is movable within a certain range.

Each carrier module 20 includes a rectangular body 21, a seat 22 formed at the body 21 to seat a semiconductor device D in the seat 22, and a pair of latches 23 movably mounted to the body 21 at opposite lateral ends of the seat 22 to hold the semiconductor device D seated in the seat 22, respectively. Operating buttons 24 are provided at the rear side of the body 21. When the operating buttons 24 are pressed, the latches 23 are moved away from each other, thereby releasing the semiconductor device D held by the latches 23. When the pressing force applied to the operating button 24 is released, the latches 23 are returned to their original positions by virtue of elastic force of elastic members (not shown) connected to the latches 23, so that the latches 23 can hold the semiconductor device D.

However, the conventional test tray with the above-mentioned carrier modules has a problem in that, when it is desired to test semiconductor devices having a thickness or size different from those of semiconductor devices corresponding to the carrier modules, it is necessary to replace the carrier modules themselves with appropriate ones.

For this reason, the costs and time taken for the replacement of the carrier modules increase.

SUMMARY OF THE INVENTION

Accordingly, the present invention is directed to a test tray for a handler for testing semiconductor devices that substantially obviates one or more problems due to limitations and disadvantages of the related art.

An object of the present invention is to provide a test tray for a handler for testing semiconductor devices which has a structure capable of reducing the costs and time taken for replacement of carrier modules, and achieving an enhancement in workability.

Another object of the present invention is to provide a test tray for a handler for testing semiconductor devices which can stably support semiconductor devices even when the ball region of each semiconductor device extends to the peripheral edge portion of the semiconductor device such that the peripheral area of the semiconductor device is very small.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a test tray for a handler for testing semiconductor devices comprises: a frame; a plurality of pockets mounted to the frame while being uniformly spaced apart from one another, each of the pockets including a seat on which a semiconductor device is to be seated; a plurality of latches mounted to the frame to be arranged in pairs for respective pockets such that the latches of each latch pair face each other at opposite sides of an associated one of the pockets, respectively, each of the latches being movable between a first position where the latch holds a semiconductor device seated in the seat of the associated pocket and a second position where the latch releases the held state of the semiconductor device; and a plurality of latch operating members each mounted to the frame, and adapted to move an associated one of the latches between the first position and the second position, each of the latch operating members being separate from the associated latch.

In another aspect of the present invention, a test tray for a handler for testing semiconductor devices comprises: a frame; a plurality of pockets mounted to the frame while being uniformly spaced apart from one another, each of the pockets including a seat on which a semiconductor device is to be seated; a plurality of fixed blocks fixedly mounted to the frame to be arranged in pairs for respective pockets such that the fixed blocks of each fixed block pair face each other at opposite sides of an associated one of the pockets, respectively, a plurality of latches each mounted to an associated one of the fixed blocks such that the latch is movable between a first position where the latch holds a semiconductor device seated in the seat of an associated one of the pockets and a second position where the latch releases the held state of the semiconductor device; and a plurality of operating buttons each movably mounted to an associated one of the fixed blocks, and connected to an associated one of the latches at one end of the operating button, each of the operating buttons moving the associated latch between the first position and the second position while being moved by an external force.

In accordance with the present invention, since the carrier module elements of the test tray, namely, the pockets for seating semiconductor devices in the test tray, the latches for holding the semiconductor devices seated in the pockets, and the latch operating members for operating the latches are comprised of separate members individually mounted to the frame, respectively. Accordingly, even when it is desired to test semiconductor devices having a thickness or size different from those of semiconductor devices corresponding to the carrier modules, it is only necessary to simply replace the pockets, in which the semiconductor devices will be seated, with appropriate ones. Accordingly, it is possible to reduce the costs and time taken for replacement of carrier modules, and to achieve an enhancement in workability.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 8A and 8B are sectional views illustrating operation of the test tray shown in FIG. 3;

FIGS. 9A and 9B are sectional views illustrating a configuration and operation of a test tray according to a second embodiment of the present invention;

FIGS. 10A and 10B are sectional views illustrating a configuration and operation of a test tray according to a third embodiment of the present invention;

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 3:
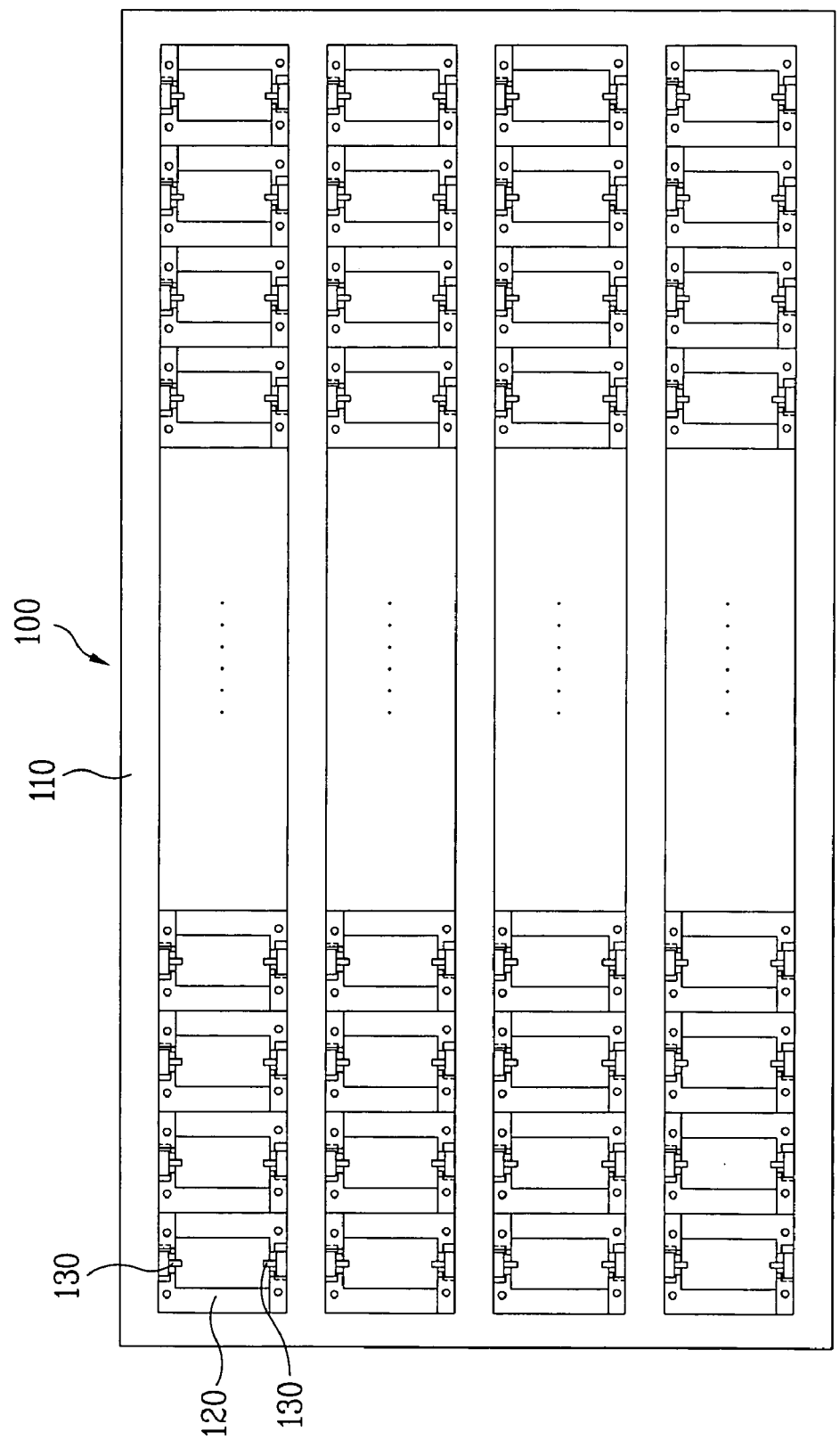
FIG. 3 is a front view illustrating a test tray for a handler for testing semiconductor devices in accordance with a first embodiment of the present invention.

Referring to FIG. 3, a test tray 100 according to the present invention is illustrated. As shown in FIG. 3, the test tray 100 includes a frame 110 made of metal, and a plurality of pockets arranged in four rows on the frame 110 while being uniformly spaced apart from one another in each row. The test tray 100 also includes a pair of latches 130 respectively mounted to the frame 110 at opposite sides of each pocket 120 while facing each other, and adapted to hold or release a semiconductor device D (FIG. 8) seated in the pocket 120, and a latch operating member mounted to the frame 110, and adapted to operate an associated one of the latches 130.

The constituent elements of the test tray 100 according to the present invention, namely, each pocket 120, in which a semiconductor device D is seated, the latches 130 arranged at opposite sides of the pocket 120, and the latch operating member adapted to operate an associated one of the latches 130 are comprised of separate members, respectively. Also, the latches 130 and latch operating members are mounted to the frame 110 of the test tray 100, respectively.

Each latch 130 is hingably mounted to the associated latch operating member separated from the associated pocket 120, and is operatively connected to an operating button 150 of the latch operating member such that the latch 130 hinges in accordance with operation of the operating button 150 to hold or release the semiconductor device D seated in the latch operating member.

Figure 4:
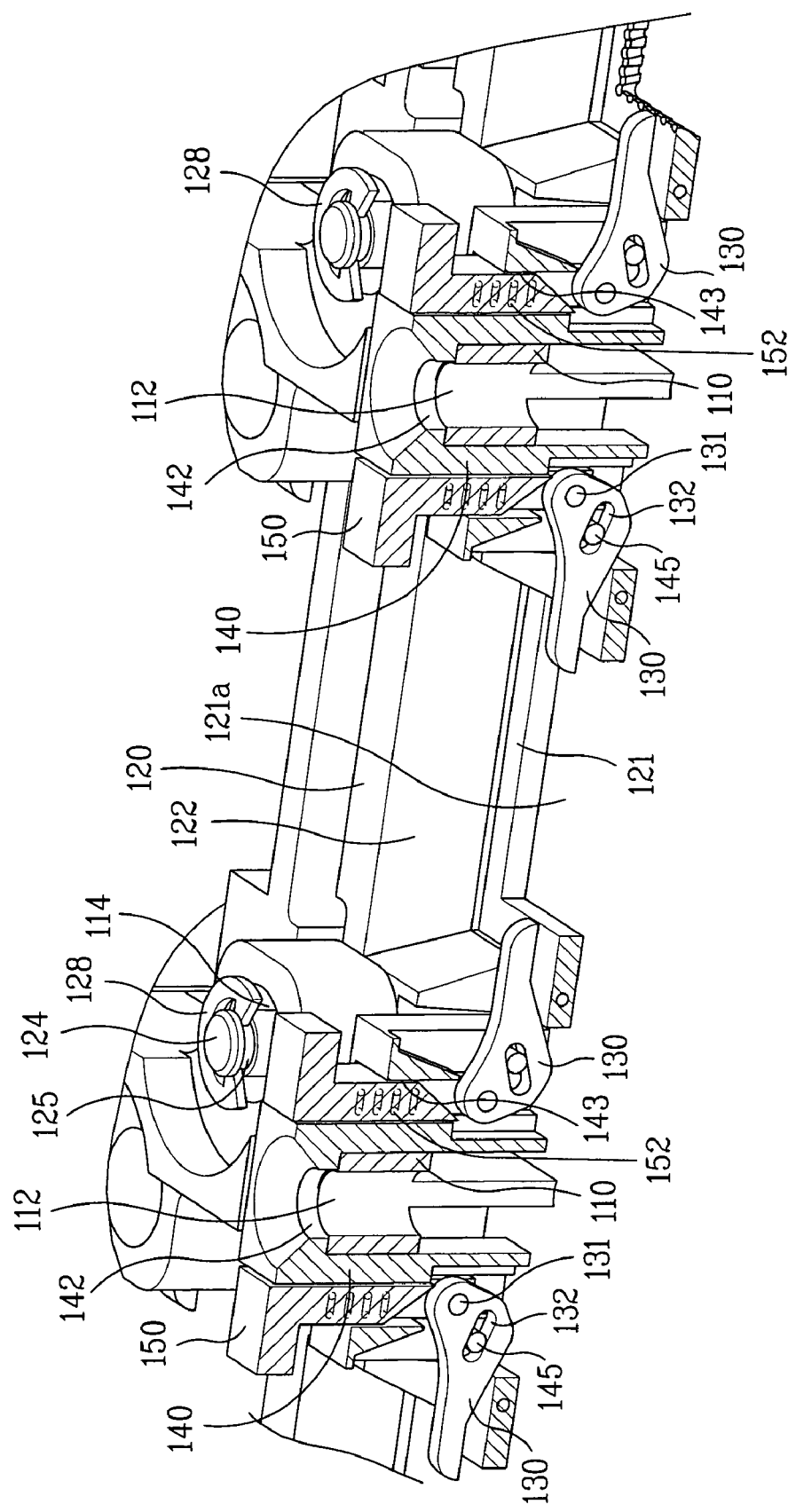
FIG. 4 is a partially-broken perspective view illustrating latches and latch operating members included in the test tray of FIG. 3.
Figure 5:
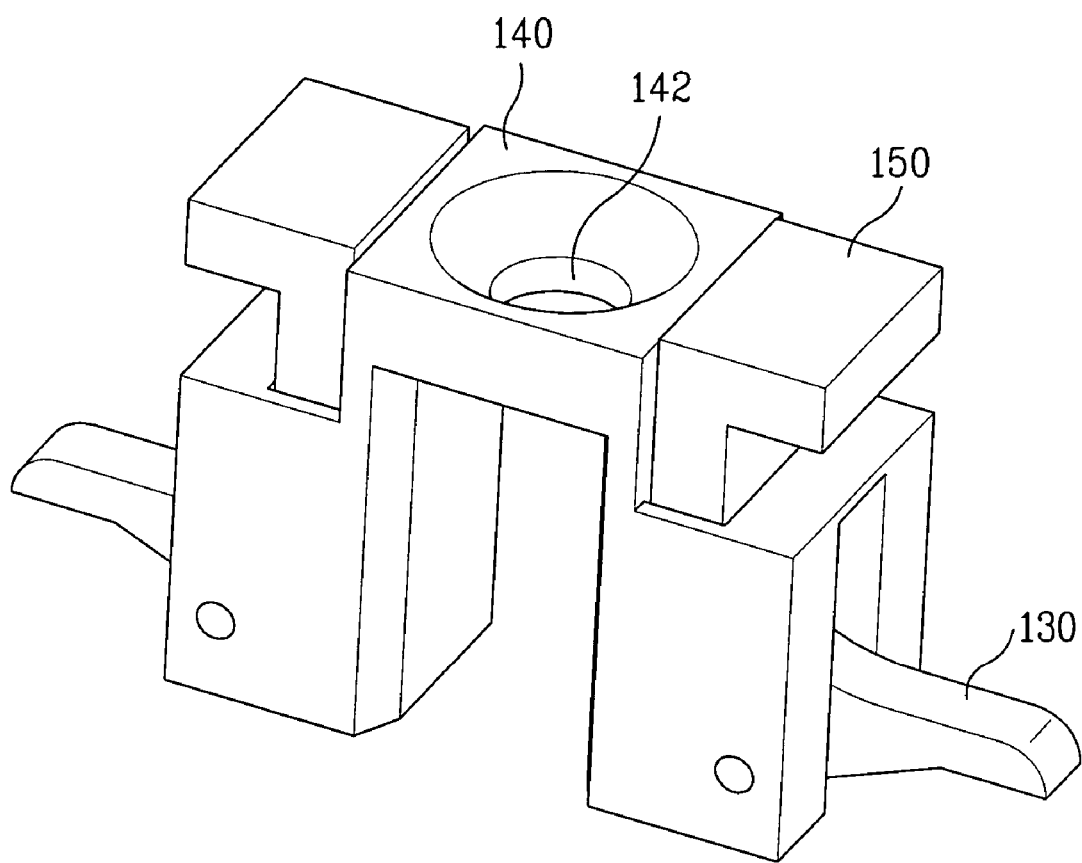
FIG. 5 is a perspective view illustrating a structure of the latch operating member included in the test tray of FIG. 3.

As shown in FIGS. 4 and 5, each latch operating member includes a fixed block 140 fixedly mounted to the frame 110 of the test tray. The operating button 150, which is also included in the latch operating member, is fitted in the fixed block 140 such that the operating button 150 is vertically movable. The latch operating member also includes a hinge pin 131 adapted to hingably connect the latch 130 to a lower portion of the operating button 150.

The operating button 150 is fitted in an upwardly-opened fitting hole 143 such that the operating button 150 is vertically movable along the fitting hole 143. The operating button 150 is elastically supported by compression springs 152 arranged at opposite lateral portions of the operating button 150 such that the operating button 150 is always forced upward.

An inclined guide slot 132 is formed at the latch 130. A guide pin 145 is mounted to the fixed block 140. The guide pin 145 is received in the guide slot 132 to guide the hinging operation of the latch 130.

In the illustrated embodiment, the fixed block 140 is threadedly coupled to the frame 110. That is, a coupling hole 142 is centrally formed at the fixed block 140. Also, a threaded coupling hole 112 is formed in the frame 110 at a position corresponding to the coupling hole 142 of the fixed block 140. A screw (not shown) is fastened to the coupling hole 142 of the fixed block 140 and the threaded coupling hole 112 of the frame 110, so that the fixed block 140 is fastened to the frame 110.

It is preferred that each of the latch operating members mounted to intermediate portions of the frame 110, namely, frame portions extending between adjacent ones of the rows of the pockets 120, be configured such that the fixed block 140 of the latch operating member carries a pair of latches 130 arranged opposite to each other, as shown in FIG. 5. In accordance with this latch operating member configuration, it is possible to hold semiconductor devices D in two pockets respectively arranged in adjacent two pocket rows, using one fixed block 140 mounted to the frame 110, and thus, to reduce the number of the latch operating members to be mounted to the frame 110. In other words, the process for mounting the latch operating members to the frame 110 can be easily achieved.

In the illustrated case, each of the latch operating members mounted to edge portions of the frame 110 is configured such that the fixed block 140 of the latch operating member carries one latch 130 only at one side of the fixed block 140.

Figure 6:
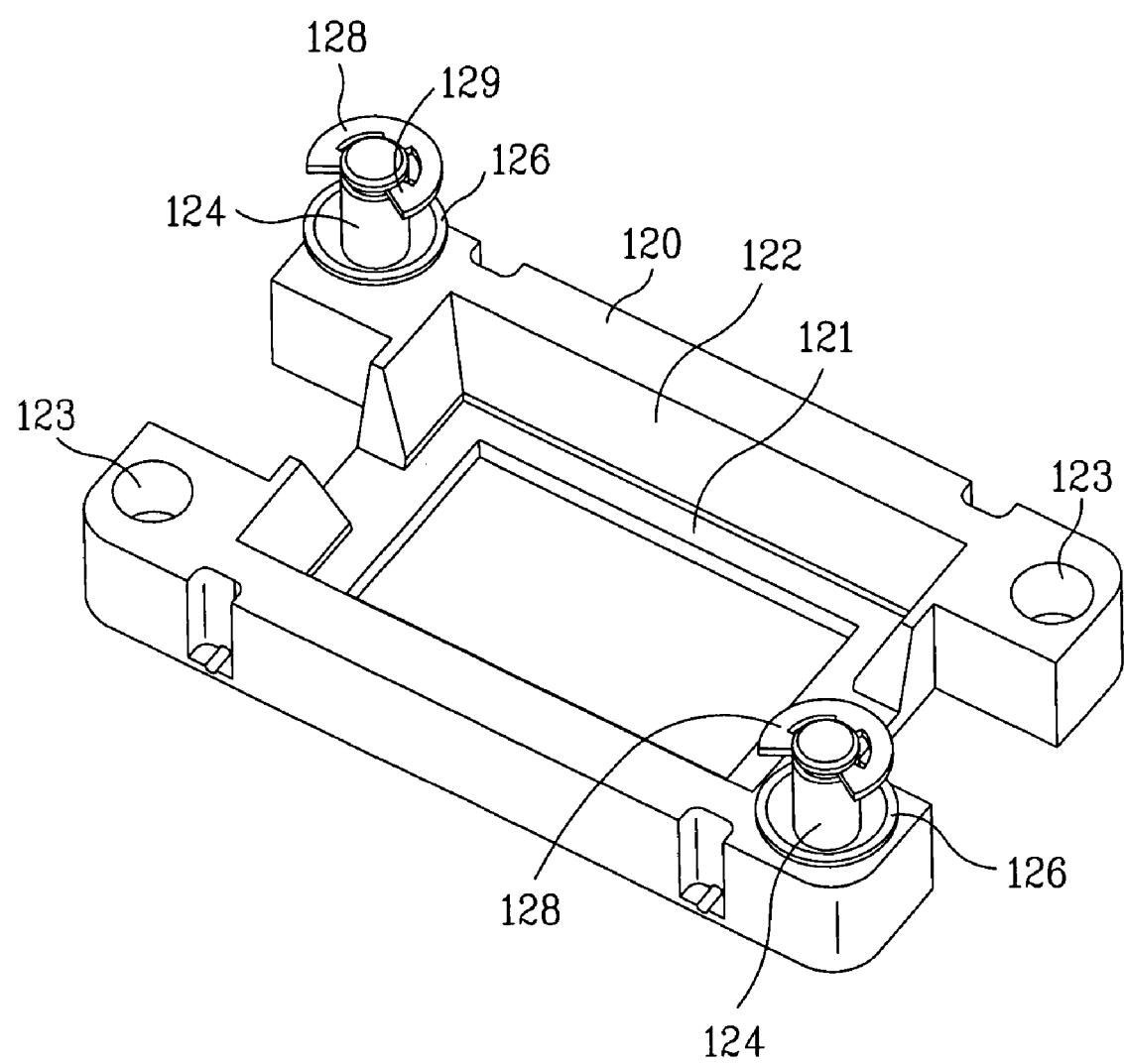
FIG. 6 is a perspective view illustrating a structure of a pocket included in the test tray of FIG. 3.
Figure 7:
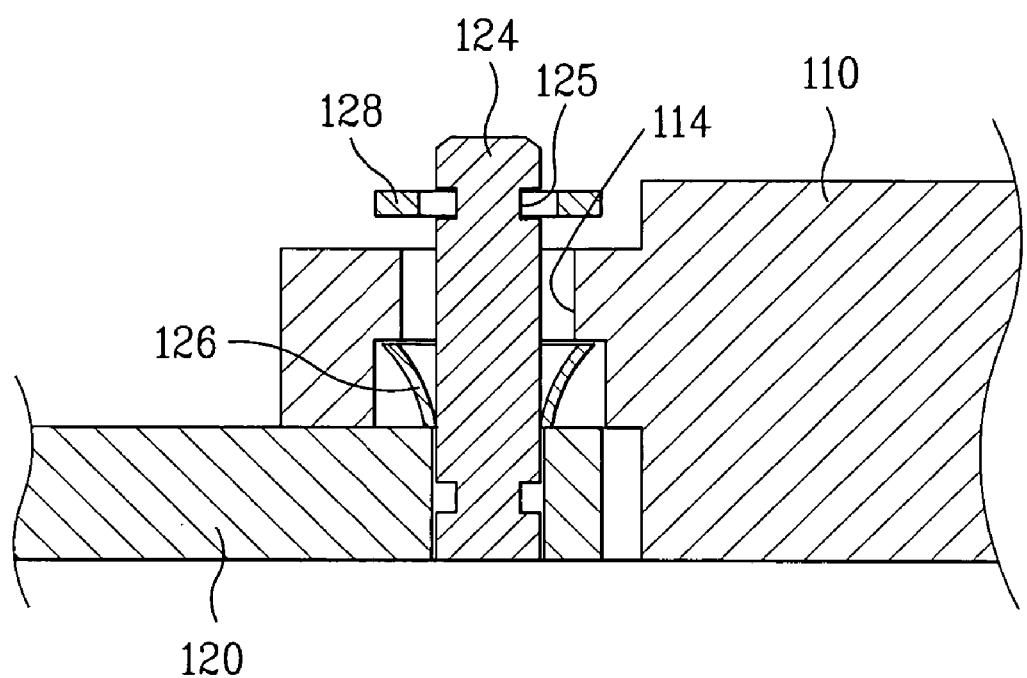
FIG. 7 is a sectional view illustrating a state in which the pocket is mounted to a frame in the test tray of FIG. 3.

Meanwhile, as shown in FIGS. 6 and 7, each pocket 120 has a rectangular hexahedral structure in which an upwardly-opened cavity 122 is centrally formed. A seat 121, on which the edge portions of a semiconductor device D will be seated, is formed at a bottom surface of the cavity 122. An opening 121a is formed through a central portion of the seat 121 to outwardly expose the balls or leads of the semiconductor device D seated on the seat 121.

Positioning holes 123 are formed at two corner portions of each pocket 120 facing each other in a diagonal direction. Connecting shafts 124 are also formed at the remaining two corner portions of each pocket 120. The connecting shafts 124 are inserted into stepped mounting holes 114 formed at the frame 110 to mount the pocket 120 to the frame 110.

Each connecting shaft 124 has a diameter smaller than the inner diameter of each mounting hole 114 of the frame 110 such that the connecting shaft 124 is radially movable within a certain range in the mounting hole 114.

A silicon spring 126 having a substantially conical shape is fitted around each connecting shaft 124. The silicon spring 126 has a lower end contacting the outer peripheral surface of the connecting shaft 124, and an upper end coming into contact with a stepped portion of the mounting hole 114 in a state in which the connecting shaft 124 is inserted into the mounting hole 114. Accordingly, the silicon spring 126 causes the connecting shaft 124 to be elastically supported by the frame 110. The silicon spring 126 also serves to prevent, to some degree, the connecting shaft 124 from being separated from the mounting hole 114.

An annular groove 125 is formed at an upper end portion of each connecting shaft 124. An E-ring 128 is fitted around the annular groove 125, in order to prevent the connecting shaft 124 from being separated from the mounting hole 114. The E-ring 128 is opened at one side thereof, and is provided with engaging pieces 129 radially inwardly protruded from an inner peripheral surface of the E-ring 128 and adapted to be engaged with the annular groove 125. The E-ring 128 has an outer diameter larger than the inner diameter of the mounting hole 114, so that the E-ring 128 cannot pass through the mounting hole 114.

The reason why each pocket 120 is mounted to the frame 110 of the test tray 100 while being more or less movable with respect to the frame 110 will now be described. Since the test tray 100 is heated in a preheating chamber (not shown) during a high-temperature test for semiconductor devices loaded in the test tray 100, the test tray 100 may be thermally strained, thereby causing the pockets 120 mounted to the test tray 100 to vary in position. For this reason, if the pockets 120 are fixed to the test tray 100 without being more or less movable, there may be a possibility that the semiconductor devices D in the pockets 120 cannot be connected or are inaccurately connected to the test sockets (not shown) in the test site.

However, where the pockets 120 are mounted to the frame 110 while being more or less elastically movable with respect to the test tray 100, as described above, the pockets 120 can be automatically aligned with respective test sockets even in a state in which the pockets 120 have been misaligned from respective test sockets, because the pockets 120 are moved within a certain range with respect to respective sockets, to be aligned with respective test sockets. Accordingly, the semiconductor devices D in the pockets 120 can be accurately connected to respective test sockets.

Hereinafter, operation of the test tray having the above-described configuration according to the present invention will be described. For simplicity, the following description will be described only in conjunction with one latch associated with one pocket, and one latch operating member associated with the latch.

In a state in which no external pressing force is applied to the operating button 150 of the latch operating member, the operating button 150 is upwardly urged by the elastic force of the compression springs 152, so that the operating button 150 is maintained at an upper position thereof, as shown in FIG. 8A. Also, the latch 130 is urged to hinge about the hinge pin 131 such that the outer end of the latch 130 moves inwardly of the pocket 120, thereby pressing the semiconductor device D seated on the seat 121 of the cavity 122 in the pocket 120. As a result, the semiconductor device D is held in the pocket 120.

Figure 8B:
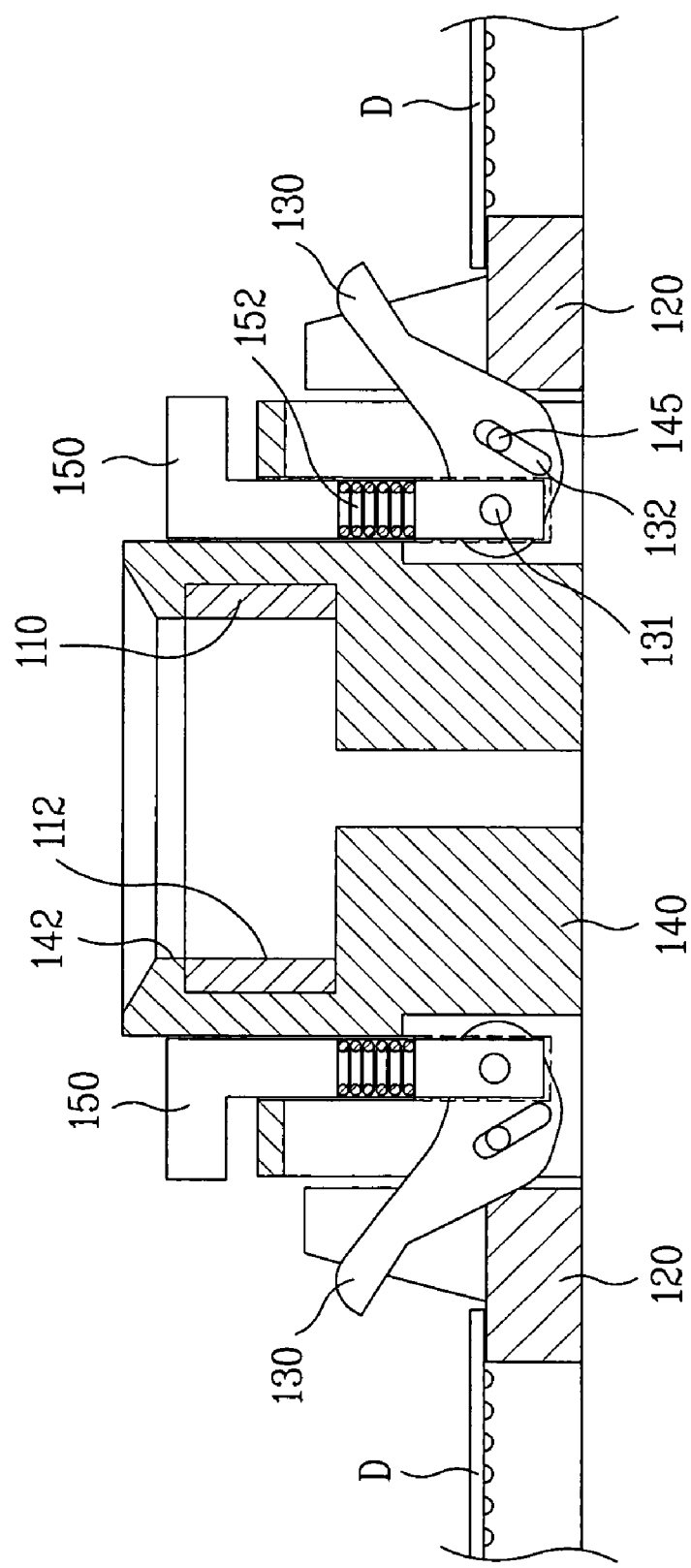

When an external pressing force is applied from the outside of the test tray 100 to the operating button 150 in the state of FIG. 8A, the operating button 150 is downwardly moved, as shown in FIG. 8B. As a result, the latch 130 hinges about the hinge pin 131 such that the outer end of the latch 130 moves outwardly of the pocket 120.

At this time, since the guide pin 145 is received in the guide slot 132 of the latch 130, the latch 130 is moved away from the pocket 120 while hinging smoothly.

When the latch 130 hinges completely, the held state of the semiconductor device D is released. Accordingly, the semiconductor device D can be freely removed from the cavity 122 of the pocket 120. In this state, the semiconductor device D can again be received in the cavity 122 of the pocket 120.

When the external pressing force applied to the operating button 150 is subsequently released, the operating button 150 is upwardly moved by the elastic force of the compression springs 152. Simultaneously, the latch 130 hinges in a direction reverse to that of the above-described procedure, so that the latch 130 is maintained such that the outer end of the latch 130 presses the semiconductor device D received in the pocket 120, as shown in FIG. 8A.

Meanwhile, when the test tray 100 is fed to the test site (not shown) of the handler to cause the semiconductor devices to be connected to the test sockets (not shown), respectively, positioning pins (not shown) formed at one side of each test socket are inserted into the positioning holes 123 provided at an associated one of the pockets 120. Thus, the positioning pins and positioning holes 123 function to enable the leads or balls of the associated semiconductor device D to be accurately connected to the test socket.

FIGS. 9A and 9B illustrate a test tray according to a second embodiment of the present invention. The test tray of this embodiment is different from that of the first embodiment, in terms of the configuration of the latch operating members adapted to hingably operate respective latches 230.

That is, each latch operating member according to this embodiment includes a fixed block 240 fixedly mounted to the frame 110 of the test tray, an operating button 250 mounted to the fixed block 240 such that the operating button 250 is vertically movable, and a vertically-extending link bar 252 hingably connected at an upper end thereof to the operating button 250 via a link pin 253. A guide pin 255 is fixed to a lower end of the link bar 252 is received in a guide slot 232 formed at an inner end portion of a latch 230.

The operating button 250 is elastically supported by compression springs 254 with respect to the fixed block 240.

The latch 230 is hingably connected at an intermediate portion thereof to the fixed block 240 via a hinge pin 231.

Operation of the test tray according to this embodiment will now be described. For simplicity, the following description will be given only in conjunction with one latch associated with one pocket, and one latch operating member associated with the latch.

In a state in which no external pressing force is applied to the operating button 250 of the latch operating member, the operating button 250 is upwardly urged by the elastic force of the compression spring 254, so that the operating button 250 is maintained at an upper position thereof, as shown in FIG. 9A, as in the above-described first embodiment. Also, the latch 230 is urged to hinge about the hinge pin 231 such that the outer end of the latch 230 moves inwardly of the pocket 120, thereby pressing the semiconductor device D seated in the cavity of the pocket 120. As a result, the semiconductor device D is held in the pocket 120.

When an external pressing force is applied from the outside of the test tray 100 (FIG. 3) to the operating button 250 in the state of FIG. 9A, the operating button 250 is downwardly moved together with the link bar 252, as shown in FIG. 9B. As a result, the latch 230 hinges about the hinge pin 231 such that the outer end of the latch 230 moves outwardly of the pocket 120.

At this time, since the guide pin 255 of the link bar 252 is received in the guide slot 232 of the latch 230, the upper end of the link bar 252 hinges about the link pin 253 connected to the operating button 250, and the guide pin 255 fixed to the lower end of the link bar 252 slides along the guide slot 232 of the latch 230. As a result, the latch 230 hinges.

When the latch 230 hinges completely, the held state of the semiconductor device D is released. Accordingly, the semiconductor device D can be freely removed from the pocket 120. In this state, the semiconductor device D can be again received in the pocket 120.

When the external pressing force applied to the operating button 250 is subsequently released, the operating button 250 and link bar 252 are upwardly moved by the elastic force of the compression spring 254. Simultaneously, the latch 230 hinges in a direction reverse to that of the above-described procedure, so that the latch 230 is maintained such that the outer end of the latch 230 presses the semiconductor device D received in the pocket 120, as shown in FIG. 9A.

Figure 10B:
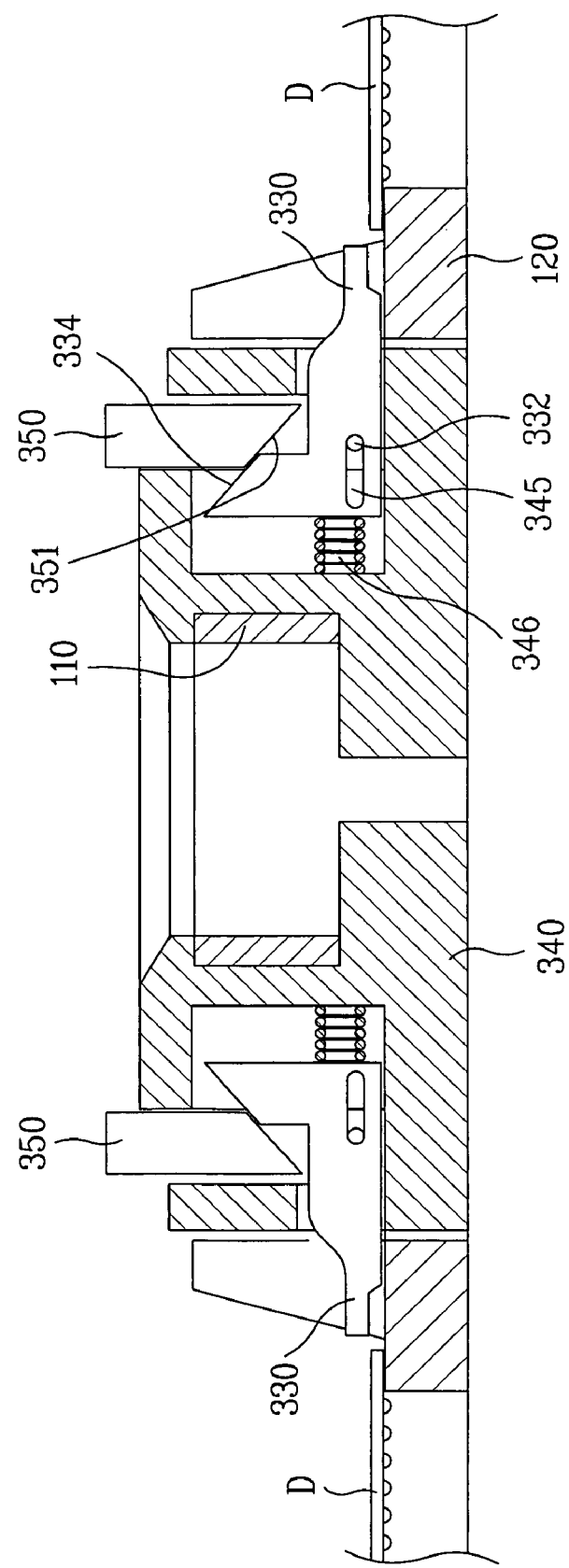

FIGS. 10A and 10B illustrate a test tray according to a third embodiment of the present invention. The test tray according to this embodiment is configured such that latches perform sliding operation without performing hinging operation, to hold/release semiconductor devices in/from respective pockets 120.

In detail, the test tray 100 includes fixed blocks 340 mounted to the frame 110 of the test tray 100. A pair of latches 330 are mounted to each fixed block 340 such that each latch 330 is slidable with respect to an associated one of the pockets 120. An operating button 350 is mounted to an upper portion of each fixed block 340 such that the operating button 350 is vertically movable, in order to slide an associated one of the latches 330. A compression spring 346 is mounted in each fixed block 340 to elastically support an associated one of the latch 330 with respect to the fixed block 340.

Each latch 330 is provided with a guide slot 332. Each fixed block 340 is provided with guide pins 345, each of which is received in the guide slot 332 of the associated latch 330.

Each latch 330 is provided with an inclined contact surface 334 at an upper end of the latch 330 contacting a lower end of the associated operating button 350. Correspondingly to the inclined contact surface 334 of each latch 330, the associated operating button 350 is provided with an inclined contact surface 351 at the lower end of the operating button 350 such that the inclined contact surface 351 contacts the inclined contact surface 334. Although the inclined contact surfaces 334 and 351 are rectilinear in the illustrated embodiment, they may have a curved shape.

Operation of the test tray according to this embodiment will now be described. For simplicity, the following description will be given only in conjunction with one latch associated with one pocket, and one latch operating member associated with the latch.

When an external pressing force is applied to the operating button 350, the operating button 350 is downwardly moved, thereby causing the latch 330 to be retracted against the elastic force of the compression spring 346, as shown in FIG. 10B. As a result, the outer end of the latch 330 is retracted from the pocket 120. Accordingly, the semiconductor device D can be freely removed from the pocket 120. In this state, the semiconductor device D can be again received in the pocket 120.

When the external pressing force applied to the operating button 350 is subsequently released, the latch 330 slides in a direction reverse to that of the above-described procedure by virtue of the elastic force of the compression spring 346. As a result, the outer end of the latch 330 is extended into the pocket 120, as shown in FIG. 10A, thereby holding the semiconductor device D in the pocket 120.

Meanwhile, since the guide pin 345 is received in the guide slot 332 of the latch 330, the latch 330 can smoothly slide in accordance with the guiding operation of the guide pin 345. In addition to the guiding function, the guide pin 345 functions as a stopper to limit the movement of the latch 330 to a desired position.

Figure 1:
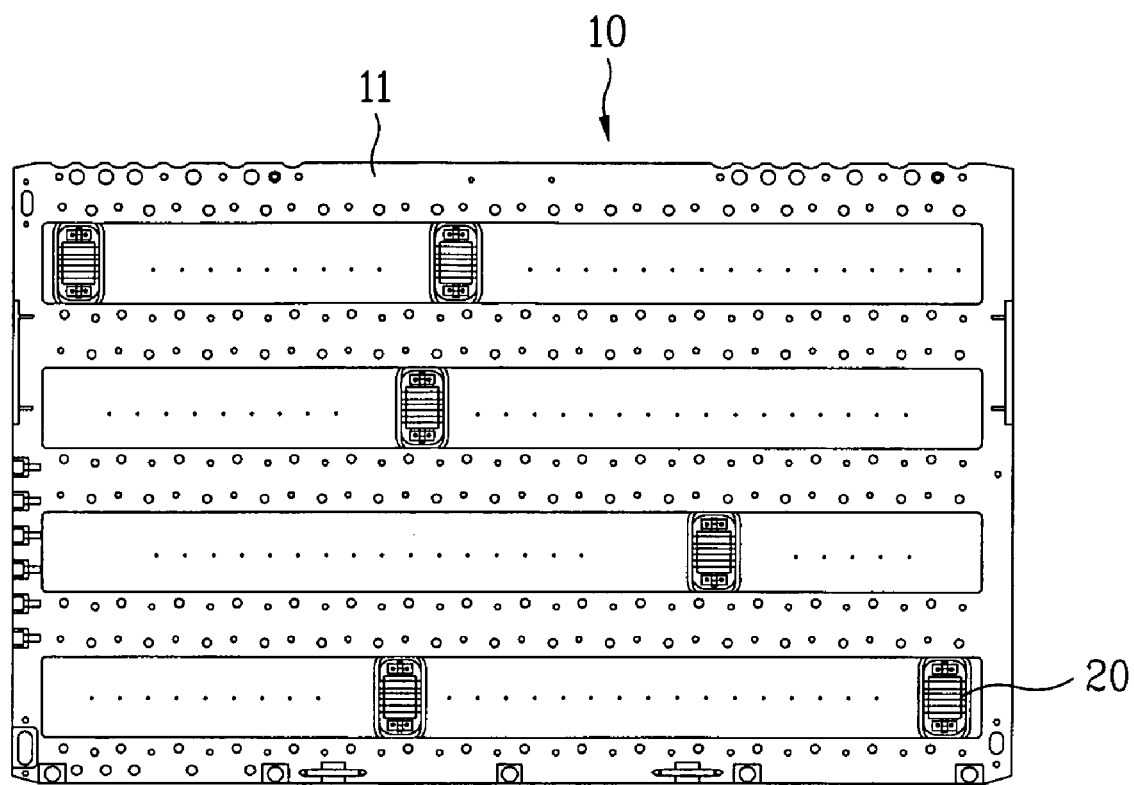
FIG. 1 is a front view illustrating an example of a conventional test tray for a handler for testing semiconductor devices.
Figure 2:
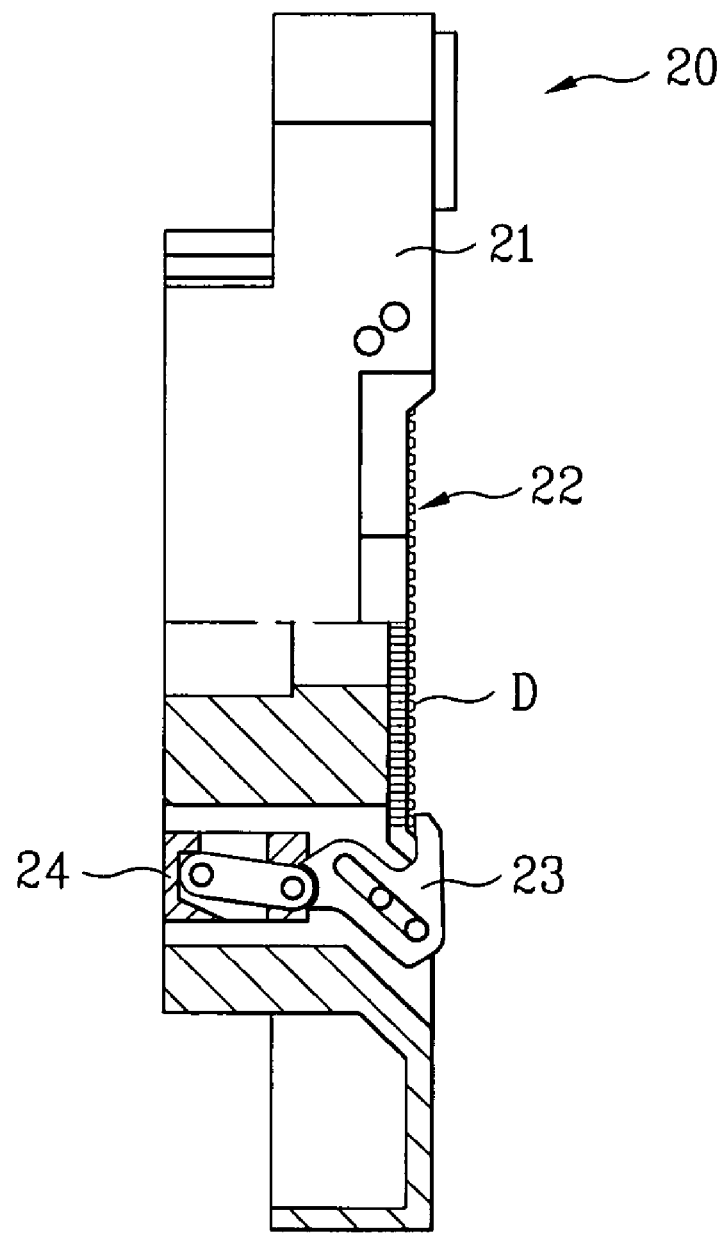
FIG. 2 is a sectional view illustrating a part of a conventional carrier module mounted to the test tray of FIG. 1.

In the above-described embodiments of the present invention, the carrier module elements of the test tray 100, namely, the pockets 120 for seating semiconductor devices D in the test tray 100, the latches 130, 230 or 330 for holding the semiconductor devices D seated in the pockets 120, and the latch operating members for operating the latches 130, 230, or 330, are comprised of separate members individually mounted to the frame 110, respectively. Accordingly, even when it is desired to test semiconductor devices having a thickness or size different from those of semiconductor devices corresponding to the carrier modules, it is unnecessary to replace the carrier modules themselves with appropriate ones, contrary to the conventional test tray 10 which uses carrier modules 20 (FIG. 2) each having an integrated structure. In accordance with the present invention, it is only necessary to simply replace the pockets 120 with appropriate ones.

In accordance with the present invention, the latches and latch operating members may have various structures different from the above-described structures.

Figure 11:
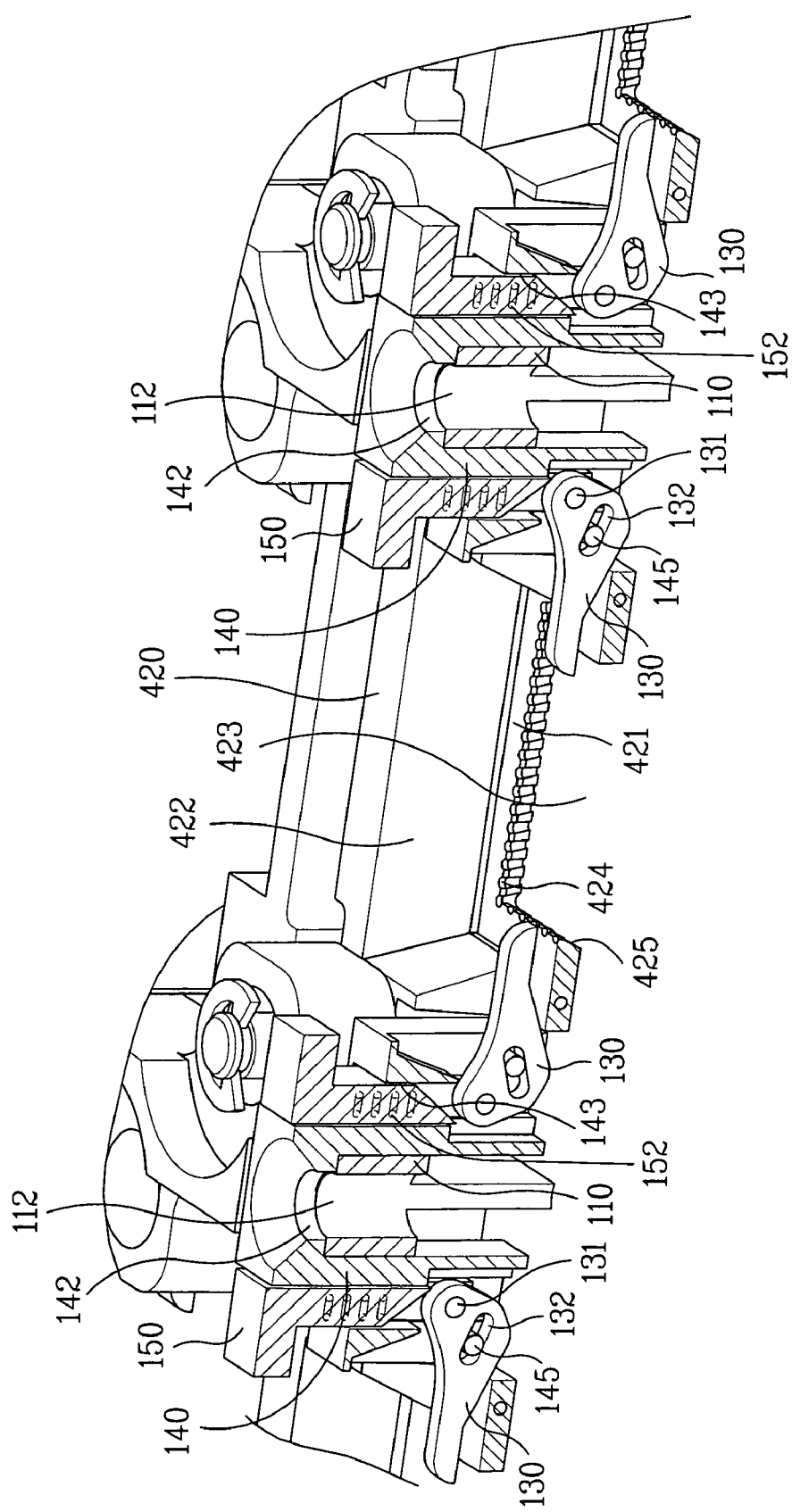
FIG. 11 is a partially-broken sectional view illustrating a configuration of a test tray according to a fourth embodiment of the present invention, similarly to FIG. 3.
Figure 12:
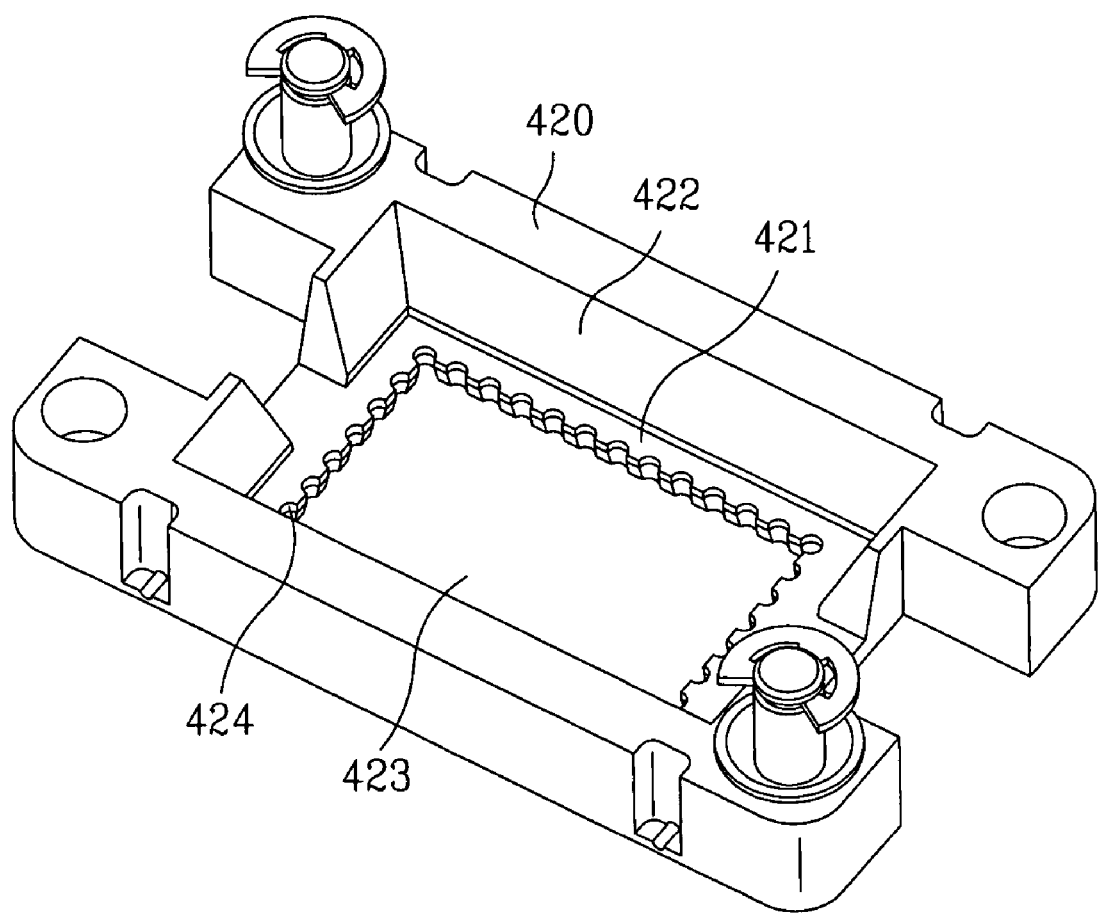
FIG. 12 is a perspective view of a pocket included in the test tray of FIG. 11.
Figure 13:
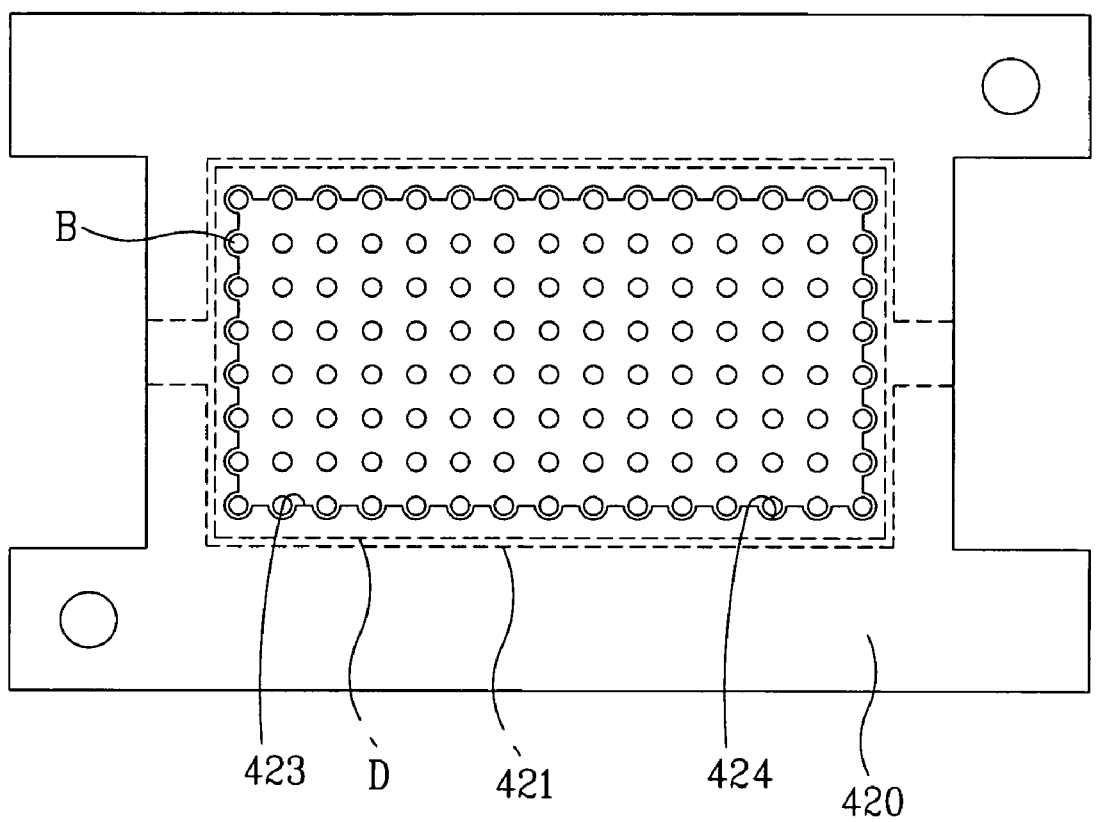
FIG. 13 is a bottom view illustrating the test tray of FIG. 11.

FIGS. 11 to 13 illustrate a test tray according to a fourth embodiment of the present invention. The test tray according to this embodiment is identical to that of the test tray according to the first embodiment, except for pockets 420. Accordingly, the remaining constituent elements of the test tray, except for the pockets 420, are designated by the same reference numerals, respectively, and no detailed description thereof will be given.

Each pocket 420 according to this embodiment includes an upwardly-opened cavity 422 formed at a central portion of the pocket 420, and a seat 421 formed at the bottom surface of the cavity 422, to enable the edge portions of a semiconductor device D to be seated on the seat 421. An opening 423 is formed through a central portion of the seat 421 to outwardly expose the balls or leads of the semiconductor device D seated on the seat 421.

Continuous ball guide grooves 424 are formed along the inner peripheral surface of the seat 421 defining the opening 423, to partially receive outermost ones of the outer terminals, namely, balls B, of the semiconductor device D seated on the seat 421. The ball guide grooves 424 have an arc shape partially corresponding to the shape of the balls B.

In accordance with this embodiment, the seat 421 has a thickness larger than the height of the balls B of the semiconductor device D. Of course, the thickness of the seat 421 may be smaller than the height of the balls B of the semiconductor device D such that the balls B are downwardly protruded through the opening 423, in accordance with the shape and size of the connecting terminals provided at the test sockets of the handler, to which the test tray is applied.

Where the thickness of the seat 421 is larger than the height of the balls B of the semiconductor device D, as in the pocket 420 according to the illustrated embodiment, it is preferred that each ball guide groove 424 be provided at a lower portion thereof with an inwardly upwardly inclined guide surface portion 425.

The pockets 420 provide various advantages, as follows.

When semiconductor devices D are seated in the seats 421 of respective pockets 420 after being fed by an external device feeder (not shown), the outermost balls B of each semiconductor device D are received in respective ball guide grooves 424 of the associated seat 421 defining the associated opening 423. Thus, each semiconductor device D seated in the associated pocket 420 is not only supported by the associated seat 421, but is also supported by regions defined between adjacent ball guide grooves 424. Accordingly, each semiconductor device D can be stably supported. In particular, even when the ball region of each semiconductor device D extends to the peripheral edge portion of the semiconductor device D such that the peripheral area of the semiconductor device D is very small, it is possible to stably support the semiconductor device D.

Although the seat 421 of each pocket 420 is integral with the pocket 420 in the illustrated embodiment, the seat 421 may be fabricated separately from the body of the pocket 420. In this case, the seat 421 may be separably coupled to the test tray by means of fasteners such as screws.

As apparent from the above description, in accordance with the present invention, even when it is desired to test semiconductor devices having a thickness or size different from those of semiconductor devices corresponding to the carrier modules, it is only necessary to simply replace the pockets, in which the semiconductor devices will be seated, with appropriate ones. Accordingly, it is possible to reduce the costs and time taken for replacement of carrier modules, and to achieve an enhancement in workability.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A test tray for a handler for testing semiconductor devices, comprising:
   a frame;
   a plurality of pockets mounted to the frame while being spaced apart from one another, each of the pockets including a seat on which a semiconductor device is to be seated;
   a plurality of latches mounted to the frame to be arranged in pairs for respective pockets such that the latches of each latch pair face each other at opposite sides of an associated one of the pockets, respectively, each of the latches being movable between a first position where the latch holds a semiconductor device seated in the seat of the associated pocket and a second position where the latch releases the held state of the semiconductor device; and
   a plurality of latch operating members each mounted to the frame, wherein the plurality of latch operating members move an associated one of the latches between the first position and the second position and wherein each of the latch operating members is separate from the associated latch.

2. The test tray according to claim 1, wherein each of the latches is connected to the associated latch operating member such that the latch hinges between the first position and the second position to hold or release a semiconductor device in or from the associated pocket in accordance with an operation of the latch operating member.

3. The test tray according to claim 2, wherein each of the latch operating members comprises:
   a fixed block fixedly mounted to the frame;
   an operating button mounted to the fixed block such that the operating button is rectilinearly movable; and
   a hinge pin which hingably connects the latch associated with the latch operating member to one end of the operating button.

4. The test tray according to claim 3, wherein the latch operating member further comprises:
   an elastic member which elastically supports the operating button with respect to the fixed block.

5. The test tray according to claim 3, wherein:
   the latch has a guide slot; and
   the fixed block has a guide pin which is received in the guide slot of the latch to guide the hinging operation of the latch.

6. The test tray according to claim 3, wherein the fixed blocks of the latch operating members associated with adjacent ones of the latches in adjacent ones of the latch pairs form a common fixed block such that respective latches associated with the latch operating members and respective operating buttons of the latch operating members are arranged at opposite sides of the common fixed block while being opposite to each other.

7. The test tray according to claim 2, wherein:
each of the latches has a guide slot; and
each of the latch operating members comprises:
a fixed block fixedly mounted to the frame,
an operating button mounted to the fixed block such that the operating button is rectilinearly movable,
a link bar hingably connected to the operating button at one end of the link bar,
a hinge pin which hingably connects the latch associated with the latch operating member to the fixed block,
a guide pin fixed to the other end of the link bar, the guide pin being received in the guide slot of the associated latch, and an
elastic member which elastically supports the operating button with respect to the fixed block.

8. The test tray according to claim 7, wherein the fixed blocks of the latch operating members associated with adjacent ones of the latches in adjacent ones of the latch pairs form a common fixed block such that respective latches associated with the latch operating members and respective operating buttons of the latch operating members are arranged at opposite sides of the common fixed block while being opposite to each other.

9. The test tray according to claim 1, wherein each of the latches is connected to the associated latch operating member such that the latch slides between the first position and the second position to hold or release a semiconductor device in or from the associated pocket in accordance with an operation of the latch operating member.

10. The test tray according to claim 9, wherein
each of the latches has an inclined contact surface and a guide slot; and
each of the latch operating members comprises:
a fixed block which is fixedly mounted to the frame, and to which the latch associated with the latch operating member is slidably mounted,
an operating button mounted to the fixed block such that the operating button is rectilinearly movable, the operating button having an inclined contact surface contacting the inclined contact surface of the associated latch, and
a guide pin fixed to the fixed block, the guide pin being received in the guide slot of the associated latch.

11. The test tray according to claim 10, wherein the fixed blocks of the latch operating members associated with adjacent ones of the latches in adjacent ones of the latch pairs form a common fixed block such that respective latches associated with the latch operating members and respective operating buttons of the latch operating members are arranged at opposite sides of the common fixed block while being opposite to each other.

12. The test tray according to claim 1, further comprising:
a plurality of mounting units for mounting the pockets to the frame such that the pockets ate movable within a predetermined range, respectively.

13. The test tray according to claim 12, wherein each of the mounting units comprises:
a mounting hole formed at the frame;
a connecting shaft formed at the pocket associated with the mounting unit such that the connecting shaft is extendable through the mounting hole, the connecting shaft having a diameter smaller than a diameter of the mounting hole and having an end which is protruded from the mounting hole and is coupled to the frame while allowing the connecting shaft to be laterally movable with respect to the frame; and
an elastic ring made of a synthetic resin material and fitted around the connecting shaft to elastically support the connecting shaft in the mounting hole.

14. The test tray according to claim 13, wherein the elastic ring has a conical shape such that one end of the elastic ring contacts an outer peripheral surface of the connecting shaft, and the other end of the elastic ring contacts an inner peripheral surface of the mounting hole.

15. The test tray according to claim 13, wherein the mounting unit further comprises:
a separation preventing unit for preventing the connecting shaft from being separated from the mounting hole.

16. The test tray according to claim 15, wherein the separation preventing unit comprises:
an annular groove formed along an outer peripheral surface of the connecting shaft at the protruded end of the connecting shaft; and
an E-ring fitted around the annular groove outside the mounting hole of the frame, the E-ring having an outer diameter larger than an inner diameter of the mounting hole.

17. The test tray according to claim 1, wherein each of the pockets further includes at least one opening formed through the seat of the pocket, the opening downwardly exposing the semiconductor device seated in the seat through the seat.

18. The test tray according to claim 17, wherein the pocket further includes continuous ball guide grooves formed along an inner peripheral surface of the seat defining the opening, to partially receive outermost balls of the semiconductor device seated in the seat, the ball guide grooves having an arc shape partially corresponding to a shape of the balls.

19. The test tray according to claim 18, wherein the seat is formed integrally with the pocket.

20. The test tray according to claim 17, wherein the seat is detachably coupled to the pocket.

21. The test tray according to claim 18, wherein each of the ball guide grooves is provided with an inwardly upwardly inclined guide surface portion at a lower portion of the ball guide groove.

22. The test tray according to claim 18, wherein the opening of the seat has a depth larger than a height of the balls of the semiconductor device.

23. The test tray according to claim 17, wherein the seat is formed integrally with the pocket.

24. The test tray according to claim 18, wherein the seat is detachably coupled to the pocket.

25. A test tray for a handler for testing semiconductor devices comprising:
a frame;
a plurality of pockets mounted to the frame while being uniformly spaced apart from one another, each of the pockets including a seat on which a semiconductor device is to be seated;
a plurality of fixed blocks fixedly mounted to the frame to be arranged in pairs for respective pockets such that the fixed blocks of each fixed block pair face each other at opposite sides of an associated one of the pockets, respectively,
a plurality of latches each mounted to an associated one of the fixed blocks such that the latch is movable between a first position where the latch holds a semiconductor device seated in the seat of an associated one of the pockets and a second position where the latch releases the held state of the semiconductor device; and a plurality of operating buttons each movably mounted to an associated one of the fixed blocks, and connected to an associated one of the latches at one end of the operating button, each of the operating buttons moving the associated latch between the first position and the second position while being moved by an external force.

26. The test tray according to claim 25, further comprising:

a plurality of elastic members each adapted to elastically support one of an associated one of the latches and an associated one of the operating buttons with respect to an associated one of the fixed blocks.

* * * * *